United States Patent [19]
Ogawa et al.

[11] Patent Number: 5,574,414
[45] Date of Patent: Nov. 12, 1996

[54] HIGH-FREQUENCY LADDER TYPE PIEZOELECTRIC FILTER AND PIEZOELECTRIC RESONATOR THEREFOR

[75] Inventors: Tatsuo Ogawa; Yasuhiko Nakagawa, both of Aichi, Japan

[73] Assignee: NGK Spark Plug Co., Ltd., Aichi, Japan

[21] Appl. No.: 390,795

[22] Filed: Feb. 17, 1995

[30] Foreign Application Priority Data

Feb. 25, 1994 [JP] Japan .................................. 6-052951

[51] Int. Cl.⁶ .............................. H03H 9/00/9/205
[52] U.S. Cl. ................... 333/189; 310/357; 333/191; 333/186
[58] Field of Search .................. 333/186–192; 310/357

[56] References Cited

U.S. PATENT DOCUMENTS

| | | | |
|---|---|---|---|
| 4,633,204 | 12/1986 | Gounji et al. | 333/189 |
| 5,057,801 | 10/1991 | Kittaker et al. | 333/187 |
| 5,084,647 | 1/1992 | Inoue et al. | 333/187 |
| 5,130,680 | 7/1992 | Nagai et al. | 333/189 |
| 5,168,253 | 12/1992 | Nakagawa et al. | |
| 5,260,675 | 11/1993 | Ogawa et al. | 333/189 |
| 5,294,862 | 3/1994 | Banno et al. | 333/189 |

FOREIGN PATENT DOCUMENTS

0449300A2 10/1991 European Pat. Off. .

*Primary Examiner*—Benny Lee
*Assistant Examiner*—Darius Gambino
*Attorney, Agent, or Firm*—Finnegan, Henderson, Farabow, Garrett & Dunner, L.L.P.

[57] ABSTRACT

A ladder type piezoelectric filter of the present invention is made usable in high frequency ranges by employing a piezoelectric resonator having the second harmonic wave mode SM. A series resonator and a parallel resonator of the ladder type piezoelectric filter of the present invention are so arranged that center electrode regions and outer electrode regions are mutually polarized along opposite directions, and the center electrode regions are connected to the outer electrode regions, respectively.

7 Claims, 8 Drawing Sheets

HIGH-FREQUENCY LADDER TYPE PIEZOELECTRIC FILTER AND PIEZOELECTRIC RESONATOR THEREFOR

BACKGROUND OF THE INVENTION

1. Field of the Invention

The present invention generally relates to a ladder type piezoelectric filter used in filter circuits of radio communication apparatuses such as portable mobile radio transceivers, mobile radiotelephones or the like and piezoelectric resonator therefor. More particularly, the invention relates to a high-frequency ladder type piezoelectric filter used in high-frequency ranges not lower than 1 MHz.

2. Description of the Background Art

Conventionally, most ladder type piezoelectric filters of this general type are designed to be operable at the response frequency of 455 KHz. This type of piezoelectric filter is so arranged that both the piezoelectric resonators made in large thicknesses and small capacities with the resonant frequency of 455 KHz, and the piezoelectric resonators made in small thicknesses and large capacities with the antiresonant frequency of 455 KHz are combined with each other in the series and parallel forms, respectively, thereby forming the ladder type filter circuit.

On the other hand, recently, ladder type piezoelectric filters operable in the high frequency ranges such as 1.7 MHz or 2 MHz are required as filter devices employed in radio communication apparatus for mobile telephones. However, when the above-described conventional ladder type piezoelectric filters are redesigned so as to satisfy such requirements, although the dimension of the piezoelectric resonator operated at the frequency of 455 KHz is originally 5 mm, this dimension should be made smaller than 2 mm. Accordingly, the ladder type piezoelectric filter configured by such small sized resonators could not be realized for practical reasons.

With respect to the conventional disk-shaped piezoelectric resonator, or rectangular plate-like piezoelectric resonator having the above-described dimension of 5 mm, which vibrates along the circumferential direction, a second harmonic mode SM and a third harmonic mode TM appear together with the fundamental mode FM having the large resonance impedance around 500 KHz as represented in FIG. 12 and FIG. 13. The above-described resonators operated at 455 KHz utilize the fundamental mode FM. Even in these conventional resonators, the second and third harmonic wave modes SM and TM appear at the frequencies not lower than 1 MHz. As a result, these harmonic modes may be utilized in such a ladder type piezoelectric filter. However, since the resonance impedances of these harmonic modes are relatively low as compared with that of the fundamental mode, these harmonic modes could not be practically utilized in the piezoelectric filter.

In order to solve the above problems, the following ladder type piezoelectric filter capable of being used in high frequency ranges has been proposed. The proposed ladder type piezoelectric filter includes a series resonator and a parallel resonator. In the series resonator, a center electrode and an outer electrode are provided in a concentric form on one surface of a piezoelectric ceramics plate, and a common electrode is provided on the other surface of the plate, in which a center electrode region and outer electrode region are mutually polarized along the same direction. On the other hand, in the parallel resonator, a center electrode and an outer electrode are provided in a concentric form on one surface of a piezoelectric ceramic plate, and a common electrode is provided on the other surface of the plate, in which a center electrode region and an outer electrode region are mutually polarized along opposite directions. Then, the ladder type circuit is arranged by a plurality of thus configured piezoelectric resonators representing resonant frequencies and antiresonant frequencies higher than 1 MHz by using the second harmonic waves.

In the thus proposed ladder type piezoelectric filter, the center electrode of the series resonator and the outer electrode thereof located on the same surface of the piezoelectric ceramic plate are successively connected to the input/output line. As a consequence, with respect to such a ladder type piezoelectric filter in that the respective resonators are housed within the case in a stacked manner, desirable electric connections should be conducted, while these center electrodes and outer electrodes should be electrically insulated. Therefore, the structure of the terminal plates would become complex, and further it is rather difficult to stably maintain the electric conducting paths. Accordingly, there are problems that the shortcircuits would likely occur and thus the final products would fail.

SUMMARY OF THE INVENTION

It is an object of the present invention to provide a ladder type piezoelectric filter which is made usable in high frequency ranges by employing piezoelectric resonators having the second harmonic mode SM without any assembling difficulties.

A high-frequency ladder type piezoelectric filter of the present invention comprises: an input/output line for connecting an input terminal to an output terminal; a ground line; a parallel branch for connecting the input/output line to the ground line; a series resonator having a resonant frequency higher than 1 MHz by utilizing a secondary double harmonic wave, the series resonator comprising a piezoelectric ceramic plate having a predetermined thickness, a center electrode, an outer electrode, and a common electrode, the center electrode and the outer electrode of the series resonator being provided on one surface of the piezoelectric ceramic plate in a concentric form and being electrically insulated each other, the common electrode being provided on the other surface of the piezoelectric ceramic plate, the series resonator being inserted into the input/output line so that the center electrode of the series resonator is connected to one side of the input/output line and the common electrode of the center electrode is connected the other side of the input/output line; and a parallel resonator having a antiresonant frequency higher than 1 MHz by utilizing a secondary double harmonic wave, the parallel resonator comprising a piezoelectric ceramic plate having a predetermined thickness, a center electrode, an outer electrode, and a common electrode, the center electrode and the outer electrode of the parallel resonator being provided on one surface of the piezoelectric ceramic plate in a concentric form and being electrically connected each other, the common electrode being provided on the other surface of the piezoelectric ceramic plate, the parallel resonator being inserted into the parallel branch so that the center electrode of the parallel resonator is connected to one side of the parallel branch which is connected to the input/output line and the common electrode of the parallel resonator is connected to the other side of the parallel branch which is connected to the earth line; wherein a center electrode region and an outer electrode region of both the series resonator and the parallel resonator are mutually polarized along opposite directions.

Now, an investigation is made of a relationship between the frequency and the attenuation amount of the above-described resonator in which the center electrode and the common electrode is connected under the condition that the center electrode region of this resonator and the outer electrode region thereof are mutually polarized along the opposite directions, as illustrated in FIG. 2, and FIG. 4. As a result of this investigation, it is confirmed that the second harmonic mode represents a larger attenuation amount than that of the fundamental mode FM.

In this sort of ladder type filter, it is required to set the ratio ($C_{O1}/C_{O2}$) of the electrostatic capacitance $C_{O1}$ of the series resonator to the electrostatic capacitance $C_{O2}$ of the parallel resonator to be large in order to considerably increase the attenuation amount in blocking range. Then, in accordance with the above-described arrangement of the present invention, since the center electrode of the series resonator is electrically insulated from the outer electrode thereof, the electrostatic capacitance between the center electrode and the common electrode is connected in series with the electrostatic capacitance between the outer electrode and the common electrode in view of equivalent circuitry. This electrostatic capacity $C_{O1}$ apparently becomes small. Also, since the center electrode of the parallel resonator is electrically connected to the outer electrode thereof, the electrostatic capacitance between the center electrode and the common electrode is connected in parallel to the electrostatic capacitance between the outer electrode and the common electrode in view of equivalent circuitry. Thus, this electrostatic capacity $C_{O2}$ apparently becomes large, so that a desirable capacitance ratio ($C_{O2}/C_{O1}$) can be obtained.

As a consequence, the series resonator and the parallel resonator are arranged with maintaining such a large capacitance ratio by mutually polarizing the center electrode region and the outer electrode region along the opposite directions and by electrically connecting the center electrode of only the parallel resonator with the outer resonator thereof. Then, the center electrode is connected to the common electrode in each of the series and parallel resonators in order that the series resonators and the parallel resonators are combined with each other in series and parallel forms. As a result, it is possible to arrange such a ladder type piezoelectric filter having the high-frequency filter characteristic not lower than 1 MHz.

With the above-described structural arrangement, since the center electrodes and common electrodes of the series resonators and parallel resonators are connected with each other on their front and rear surfaces, these series and parallel resonators can be easily and electrically connected with each other when they are stacked.

As is apparent from the impedance characteristic with respect to the second harmonic wave, the above-described resonator, in which one surface of the piezoelectric ceramics plate is split into a center electrode and an outer electrode possesses large resonant and antiresonant impedances around 1.7 MHz.

BRIEF DESCRIPTION OF THE DRAWINGS

In the accompanying drawings.

DETAILED DESCRIPTION OF THE INVENTION

The detailed description of a high-frequency ladder type piezoelectric filter according to the present invention will be described with reference to the accompanying drawings as follows.

Figure 1:
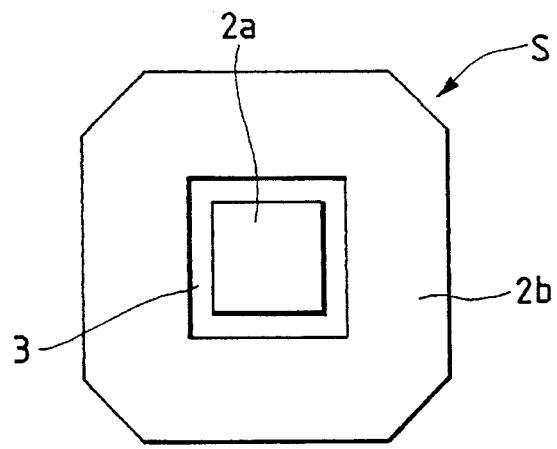
FIG. 1 is a plan view of a series resonator S.
Figure 2A:
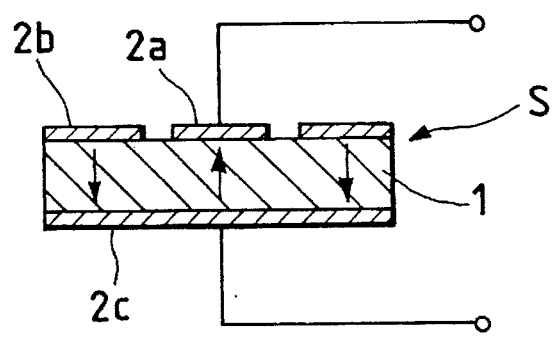
FIG. 2A is a longitudinal sectional side view of the series resonator S.

FIG. 1 and FIG. 2A indicate a piezoelectric resonator (series resonator) S having a small capacitance, which is inserted into a series branch of a ladder type filter circuit. In the piezoelectric resonator S, a center electrode 2a and an outer electrode 2b are provided adjacently via a rectangular ring-shaped groove 3 in a concentric form on one surface of a square-shaped piezoelectric ceramic plate 1 made of lead titanate zirconate and the like and having a predetermined thickness. A common electrode 2c is provided on the other surface of this piezoelectric ceramics plate 1 in such a manner that the common electrode 2c is positioned opposite to the center electrode 2a and the outer electrode 2b. A predetermined DC high electric field is applied between the center electrode 2a and the common electrode 2c along the forward direction, and also another predetermined DC high electric field is applied between the outer electrode 2b and the common electrode 2c along the direction opposite to the forward direction, so that the center and outer electrode regions are mutually polarized along the opposite directions, respectively. It should be noted that an arrow shown in FIG. 2A indicates the polarization direction.

Figure 3:
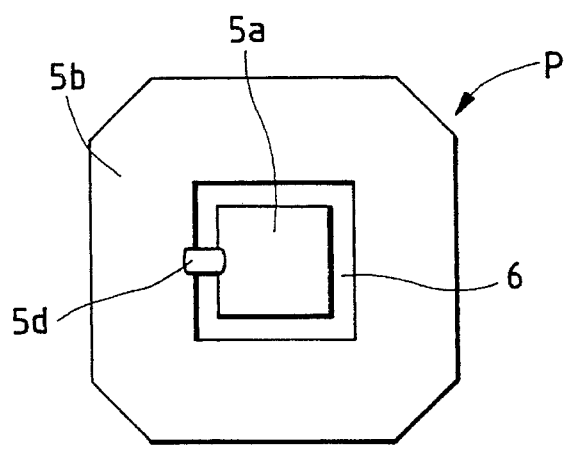
FIG. 3 is a plan view of a parallel resonator P.
Figure 4A:
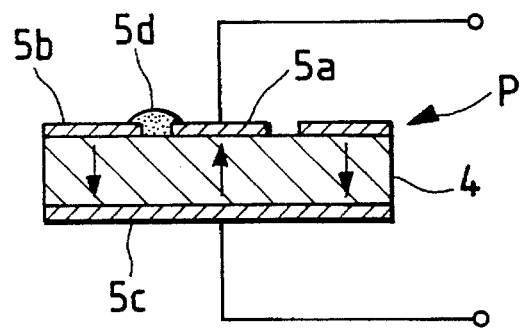
FIG. 4A is a longitudinal sectional side view of the parallel resonator P.

FIG. 3 and FIG. 4A represent a piezoelectric resonator (parallel resonator) P having a large capacitance, which is inserted into a parallel branch of the ladder type filter circuit. Similar to the series resonator S, in the parallel resonator P, a center electrode 5a and an outer electrode 5b are provided adjacently through a rectangular ring-shaped groove 6 in a concentric form on one surface of a square-shaped piezoelectric ceramics plate 4, and further a common electrode 5c is provided on the other surface of the piezoelectric ceramics plate 4. A predetermined DC high electric field is applied between the center electrode 5a and the common electrode 5c along the forward direction, whereas another predetermined DC high electric field is applied between the outer electrode 5b and the common electrode 5c along the direction opposite to the forward direction. Accordingly, the center electrode region and the outer electrode region are polarized along the opposite directions, respectively. An arrow of FIG. 4A denotes the polarization direction.

After the polarization, the center electrode 5a and the outer electrode 5b are electrically connected to each other through a conductive bridge 5d formed of solder, conductive adhesive agent or a metal vapor deposition portion and the like.

Figure 5:
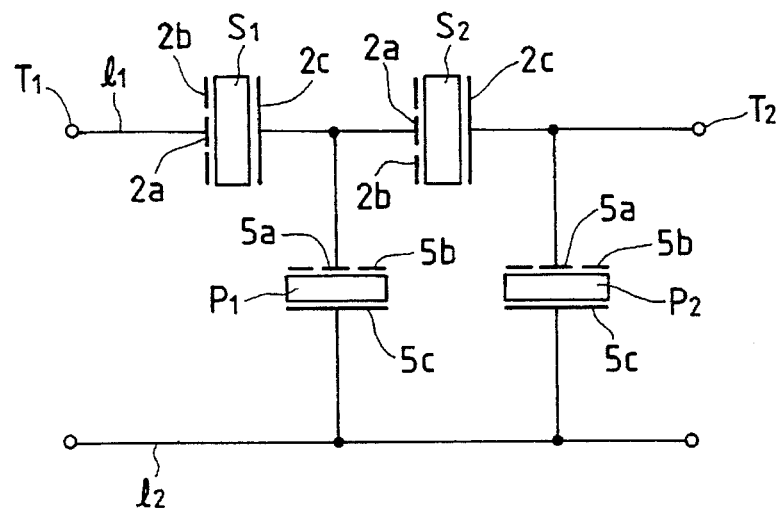
FIG. 5 is a circuit diagram of a ladder type piezoelectric filter according to the present invention.

FIG. 5 is a diagram showing an equivalent circuit diagram of a ladder type filter with employment of two series resonators $S_1$, $S_2$ each configured as shown in FIG. 1 and FIG. 2A, and two parallel resonators $P_1$, $P_2$ each configured as shown in FIG. 3 and FIG. 4A. In the ladder type filter, the center electrode 2a of the series resonator $S_1$ provided at the first stage is connected to an input terminal $T_1$ of an input/output line $l_1$, the common electrode 2c of the series resonator $S_1$ is connected to the center electrode 2a of the other series resonator $S_2$ provided at the subsequent stage, and the common electrode 2c of the series resonator $S_2$ is connected to an output terminal $T_2$. The outer electrodes 2b of the respective series resonators $S_1$ and $S_2$ are connected to neither the input/output line $l_1$ nor an earth line $l_2$, but are brought into floating states.

On the other hand, as to the parallel resonators $P_1$ and $P_2$, the center electrode 5a of the parallel resonator $P_1$ is connected to the input/output line $l_1$ between the series resonators $S_1$ and $S_2$, and the center electrode 5a of the parallel resonator $P_2$ is connected to the input/output line $l_1$ between the series resonator $S_2$ and the output terminal $T_2$. The respective common electrodes 5c of the parallel resonators $P_1$ and $P_2$ are connected to the ground line $l_2$.

Figure 6:
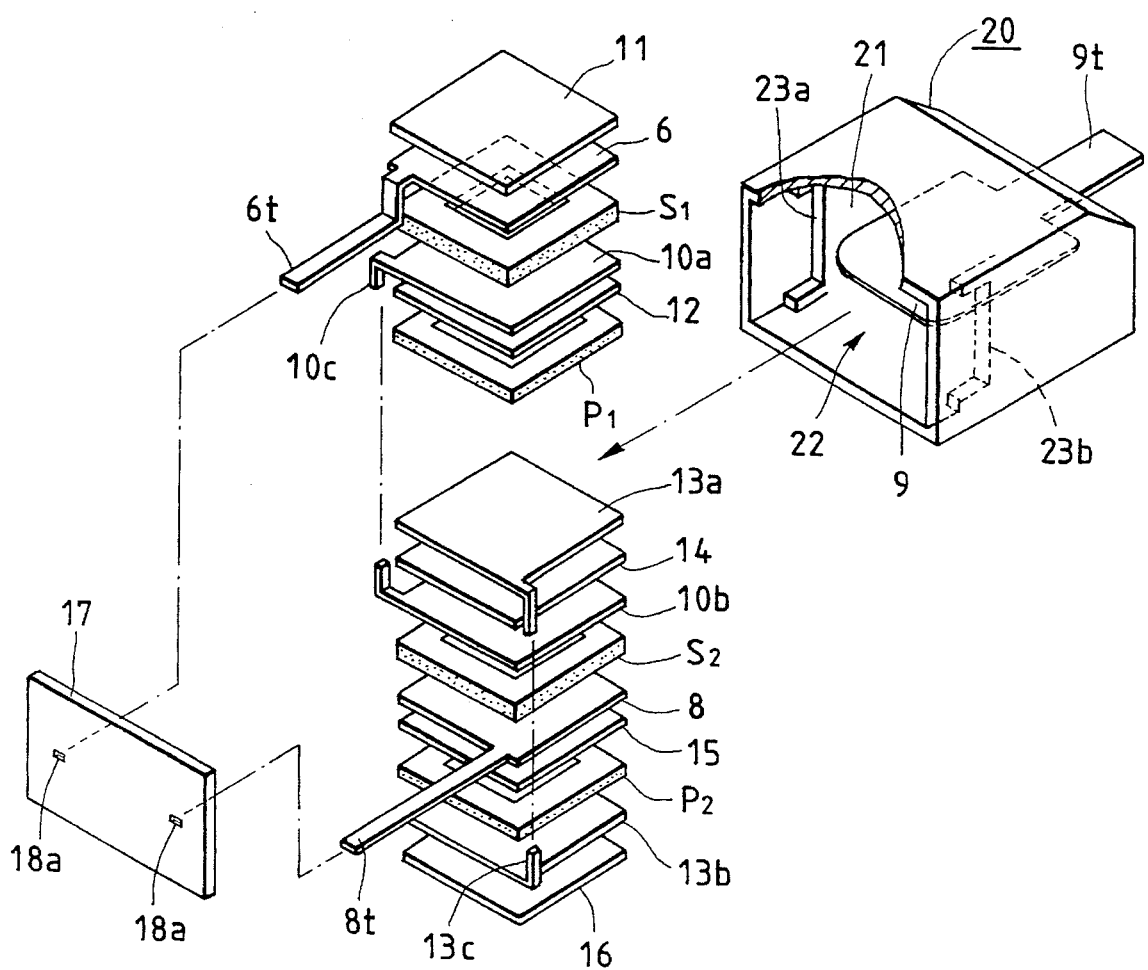
FIG. 6 is an exploded perspective view of a ladder type piezoelectric filter F.
Figure 7:
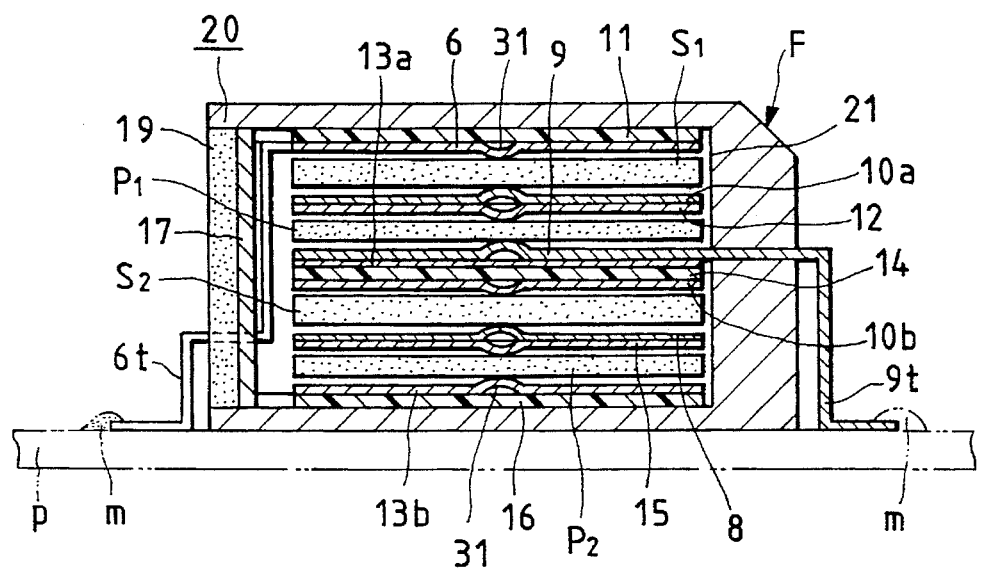
FIG. 7 is a longitudinal sectional side view of the ladder type piezoelectric filter F.

A specific structure of the ladder type filter is shown in FIGS. 6 and 7. In the drawings, an grounded terminal plate 9 is integrally assembled to a rectangular thin synthetic resin case made of insulating material 20. A connecting projection 9t is formed from one edge of the grounded terminal plate 9. In order to assemble the grounded terminal plate 9, the synthetic resin case 20 and the grounded terminal plate 9 are integrally molded by way of the insert molding in the molding process. Within a housing space 21 of this synthetic resin case 20, various sorts of members for constituting a required circuit above and under the grounded terminal plate 9 are inserted from an opening 22.

The structure of the various members housed in the housing space 21 will be explained below. First, the following components are successively inserted into the upper portion of the grounded terminal plate 9. That is, these components are a buffer plate 11, an input terminal plate 6 having one side edge on which a connecting projection 6t is formed, the series resonator $S_1$ having the larger thickness, a relay terminal plate 10a, an auxiliary terminal plate 12, and the parallel resonator $P_1$ having the smaller thickness. Also, a relay terminal plate 13a, an insulating plate 14, another relay terminal plate 10b, the series resonator $S_2$, an output terminal plate 8 having one side edge on which a connecting projection 8t is formed, an auxiliary terminal plate 15, the parallel resonator $P_2$, another relay terminal plate 13b and a buffer plate 16 are successively inserted into the lower portion of the earth terminal plate 9. These relay terminal plates 10a and 10b are integrally connected through a continuing portion 10c formed at the side portions thereof at the front portions of these relay terminal plates. Similarly, the relay terminal plates 13a and 13b are integrally connected through a continuing portion 13c formed at the side portions thereof at the front portions of these relay terminal plates. Then, in order that these continuing portions 10c and 13c are not in contact with other members, notch portions 23a and 23b are formed at opposite sides of an entrance portion of the synthetic resin case 20 forming the housing space 21 so that these continuing portions 10c and 13c are positioned therein.

In the thus constructed ladder type filter, as illustrated in FIG. 7, a pressured projection portion 31 is formed at a substantially center portion of each of the respective terminal plates so that the connections can be surely maintained in the above-described structure. As a result, the terminal plates located adjacent to the center electrodes 2a and 5a of the respective resonators $S_1$, $S_2$, $P_1$, $P_2$ are connected only to these center electrodes 2a and 5a so as to surely maintain the non-connection with the outer electrodes 2b and 5b.

With the above-described structure, under mounting conditions of these members, the center electrodes 2a of the series resonators $S_1$ and $S_2$ are connected through the connection projection 6t to the input terminal $T_1$, the common electrode 2c of the series resonator $S_2$ is connected through the connecting projection 8t to the output terminal $T_2$, and furthermore the series resonators $S_1$ and $S_2$ are mutually connected in series to each other through the relay terminal plates 10a and 10b. The common electrodes 5c of the respective parallel resonators $P_1$ and $P_2$ are connected through the relay terminal plates 13a and 13b to the grounded terminal plate 9, so that these parallel resonators $P_1$ and $P_2$ are mutually connected in parallel to each other. After this mounting procedure, a sealing plate 17 is fitted into the opening 22, the connecting projections 6t and 8t are inserted into insertion holes 18a of the sealing plate 17, and then an epoxy resin 19 is injected on the sealing plate 17. As a result, a ladder type piezoelectric filter F is constructed. This ladder type piezoelectric filter F is a basic unit circuit of the filter circuit. The connecting projections 6t, 8t, and 9t of the terminal plates 6, 8 and 9, respectively, projecting from the opposite side surfaces of the case 20 are bent, and thereafter the edge portions of the connecting projections are electrically connected through solder m to a predetermined conductive path formed on a printed circuit board p.

Figure 8:
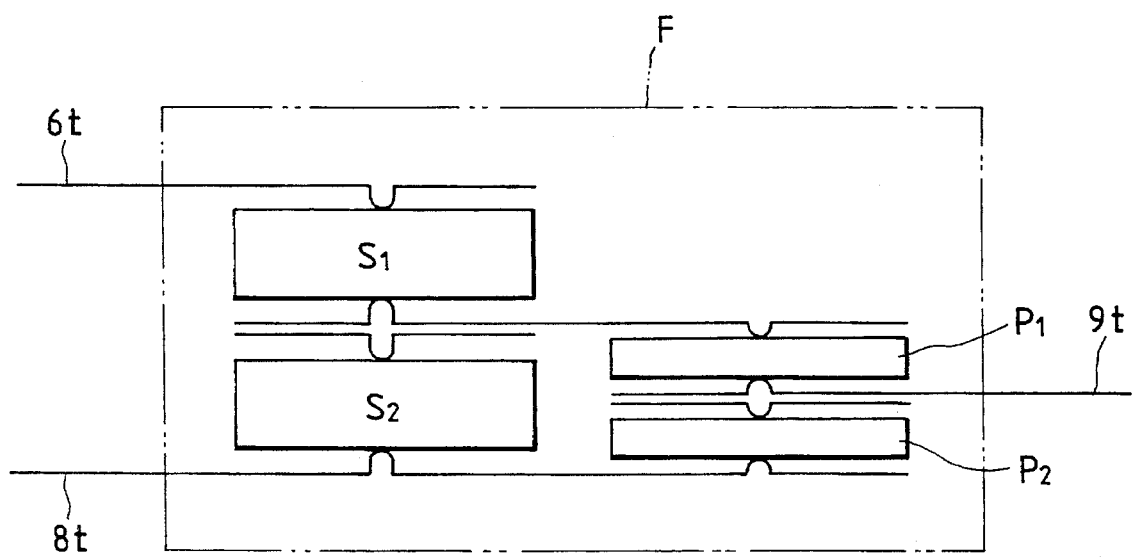
FIG. 8 is a conceptional diagram of a ladder type piezoelectric filter F having another structure.

FIG. 8 is a schematic diagram showing another ladder type piezoelectric filter F having a small thickness. To realize such a thin filter, arrangements between the parallel resonators $P_1$, $P_2$ and the series resonators $S_1$, $S_2$ are not simply stacked along the vertical direction but the parallel resonators $P_1$, $P_2$ and the series resonators $S_1$, $S_2$ are arranged along the horizontal direction as shown in FIG. 8. As described above, various assembling methods may be applied to these parallel resonators $P_1$, $P_2$ and series resonators $S_1$, $S_2$.

In the above-explained ladder type piezoelectric filter, two sets of the fundamental unit circuits each constructed of two series resonators, or two parallel resonators have been applied to the ladder type filter circuit. Alternatively, various numbers of series and parallel resonators such as one series resonator and one parallel resonator, or three series resonators and three parallel resonators may be employed as the fundamental unit circuit in the filter circuit.

Figure 9:
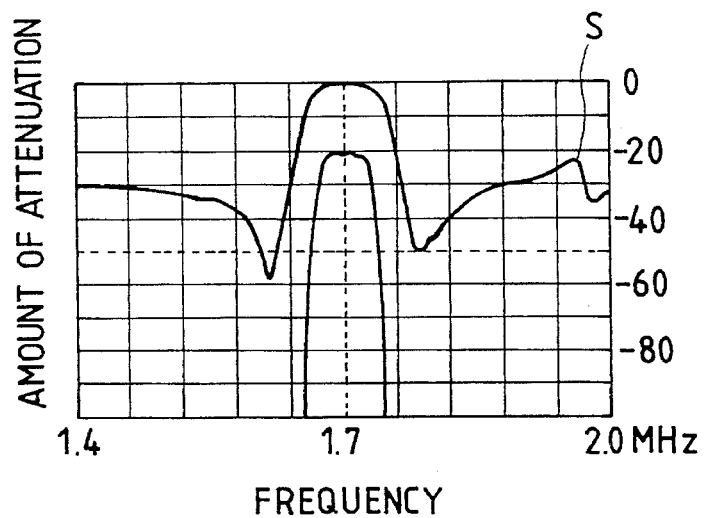
FIG. 9 is an attenuation characteristic diagram.

Next, FIG. 9 indicates measurement results of the filtering characteristics as to the ladder type piezoelectric filter F with the structure as shown in FIGS. 6 and 7, wherein input/output resistors $R_1$, $R_2$ each having 1 kilo-ohm are connected thereto. It should be noted that the piezoelectric resonators used in the measurement are defined below. As is apparent from this filtering characteristic diagram, it could be confirmed that a ladder type piezoelectric filter F having the filtering characteristic with a pass band of 1.7 MHz could be obtained.

The piezoelectric resonators S and P applied to the above-described ladder type piezoelectric filter F are defined as follows.

Figure 2B:
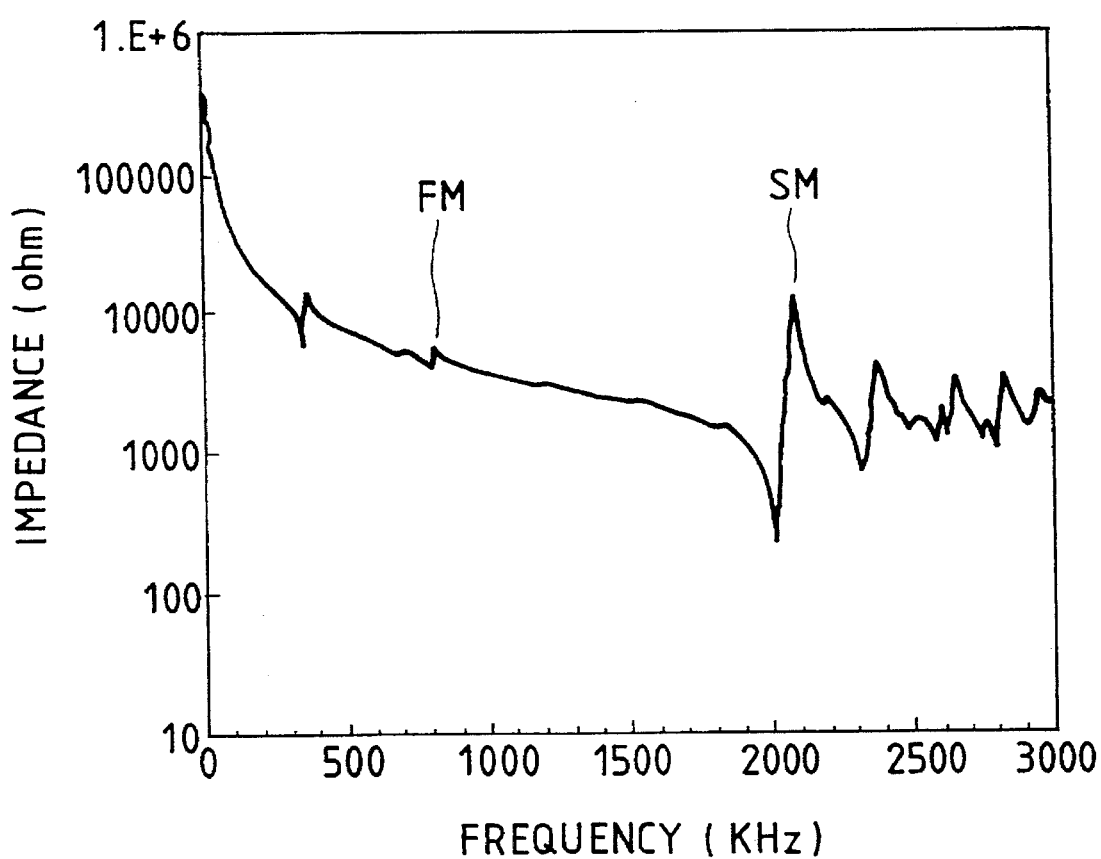
FIG. 2B is a characteristic diagram representing a relationship between a frequency and an impedance.

A) SERIES RESONATOR:

Both the center electrode $2a$ having a rectangular shape of 1.0×1.0 mm and the outer electrode portion $2b$ for surrounding the center electrode $2a$ through an insulting peripheral spacing portion having a width of 0.3 mm are formed by way of silver baking on one surface of a square-shaped piezoelectric ceramics plate made of lead titanate zirconate and having a square shape of 3.0×3.0 mm with a thickness of 0.6 mm. Further, the common electrode $2c$ is formed by way of silver baking on the other surface of the piezoelectric ceramics plate so as to entirely cover the other surface. A DC voltage of 3 KV/mm is applied between the center electrode $2a$ and the common electrode $2c$ along one direction, and also applied between the outer electrode $2b$ and the common electrode $2c$ along the other direction opposite to the one direction, so that the center electrode region and the outer electrode region are polarized. Thereafter, the resonant frequency is set to 1.7 MHz. An electrostatic capacitance $C_{01}$ of this resonator is 80 PF. A relationship between the frequency and the impedance of the series resonator is represented in FIG. 2B. From this relationship, it can be confirmed that attenuation is large at the second harmonic wave mode SM in comparison with the fundamental mode FM.

Figure 4B:
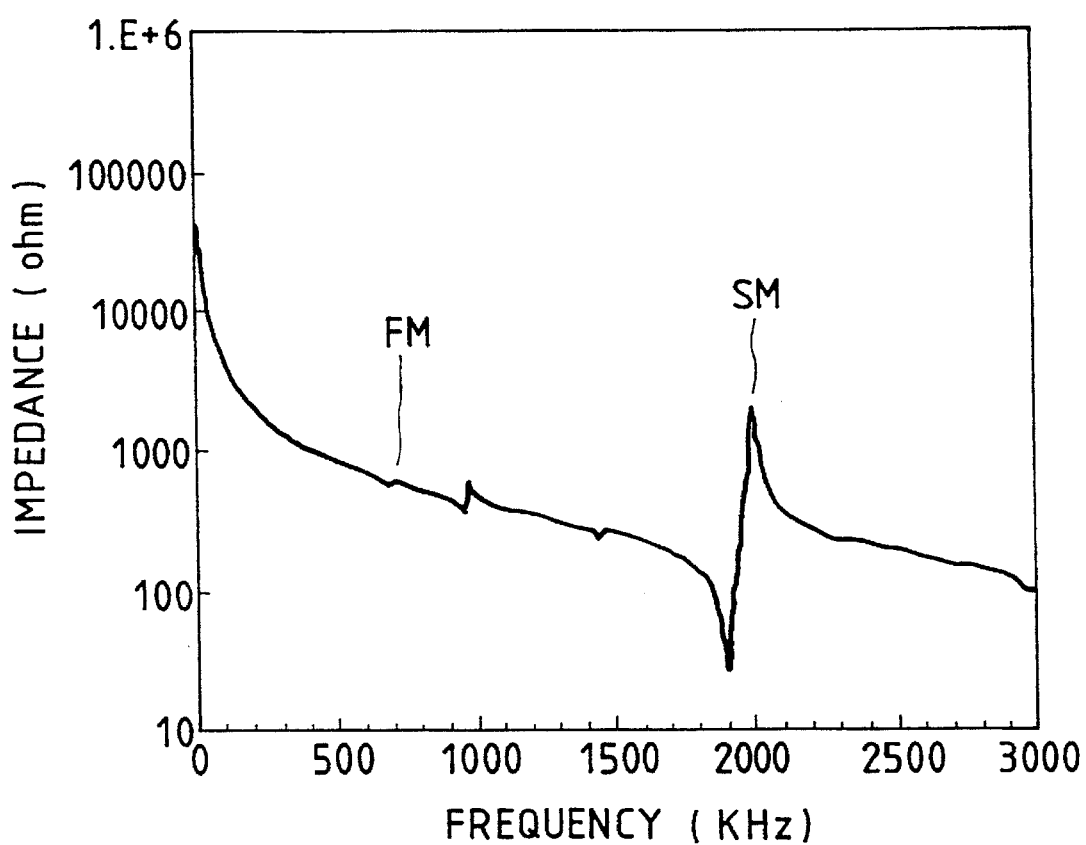
FIG. 4B is a characteristic diagram showing a relationship between a frequency and an impedance.

B) PARALLEL RESONATOR:

Both the center electrode $5a$ having a rectangular shape of 1.2×1.2 mm and an insulating peripheral spacing portion having a width of 0.3 mm are formed on one surface of a square-shaped piezoelectric plate made of the same material as that of the above-explained series resonator and having a square shape of 3.3×3.3 mm with a thickness of 0.2 mm. Also as similar to the above-explained series resonator, the electrode regions are polarized by applying the DC voltage. The center electrode $5a$ is electrically connected to the outer electrode $5b$ by a conductive bridge $5d$, which is coated in such a manner that a portion of the insulating peripheral spacing portion is bridged by the conductive bridge $5d$, and then the antiresonant frequency is set to 1.7 MHz. The parallel resonator has a large electrostatic capacitance $C_{02}$ of 400 PF. As is clear from the relation between the frequency and the impedance of the parallel resonator shown in FIG. 4B, the attenuation amount of the fundamental mode FM is very small as compared with that of the second harmonic wave mode SM.

Figure 11A:
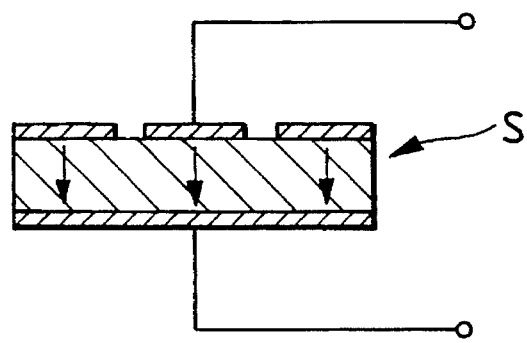
FIG. 11A is a longitudinal sectional side view of a series resonator S to be compared with the series resonator of the present invention.
Figure 11B:
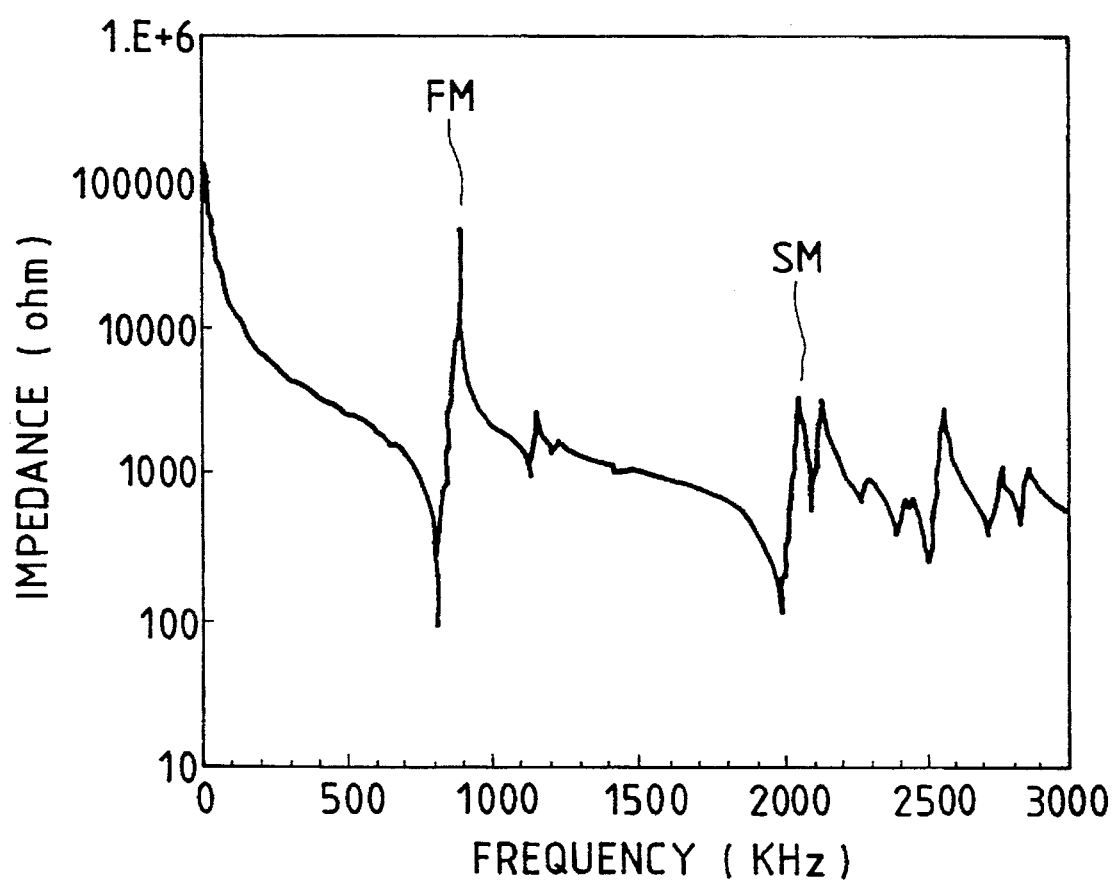
FIG. 11B is a characteristic diagram for indicating a relationship between a frequency and an impedance.
Figure 12:
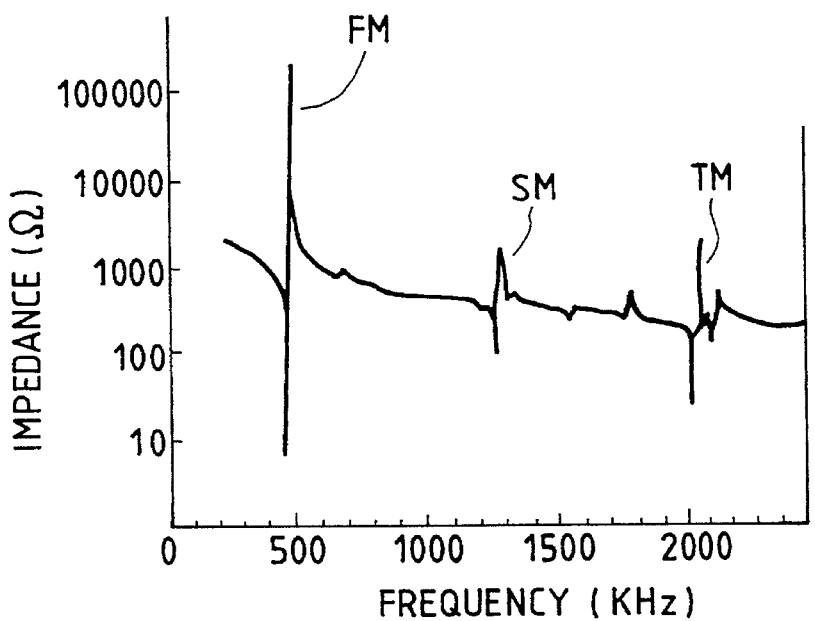
FIG. 12 is a graphic representing a relationship between the impedance and the frequency of the conventional resonator.
Figure 13:
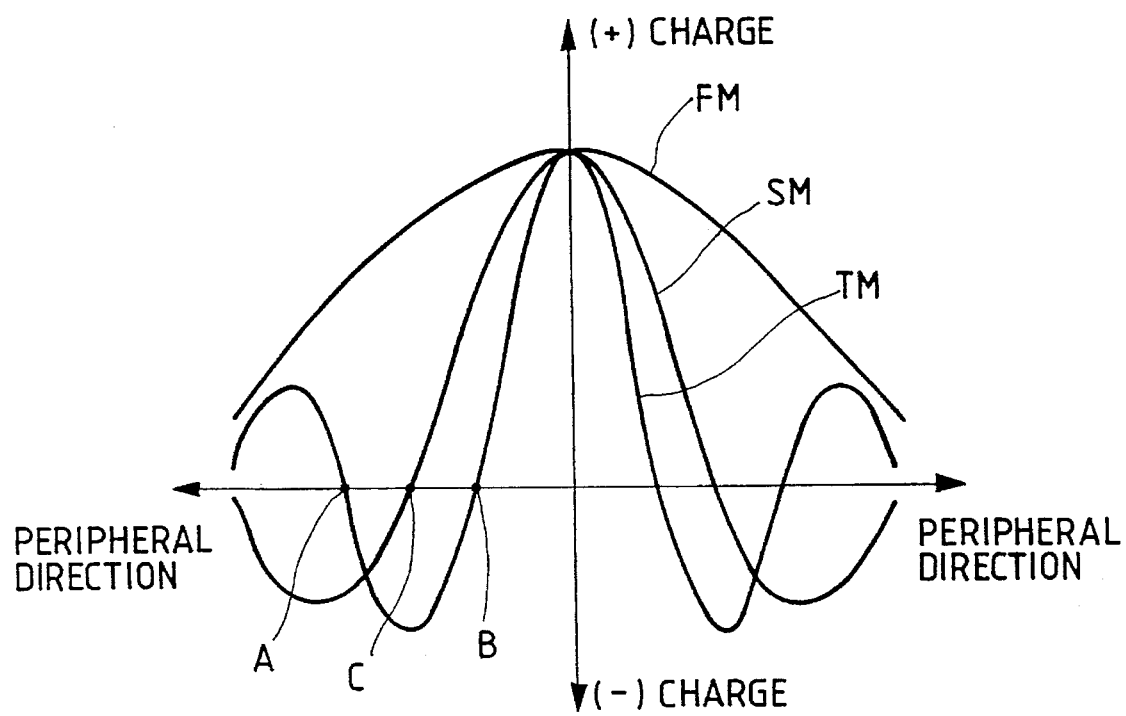
FIG. 13 is a waveform chart of the conventional resonator along its peripheral direction.

In order to compare the above-described piezoelectric resonators with the piezoelectric resonator shown in FIG. 11A, a relationship between frequencies and attenuation amounts was investigated as to such a piezoelectric resonator formed to have a similar shape to that of the above-described series resonator. In this piezoelectric resonator, the polarization direction of the center electrode region and the polarization direction of the outer electrode region were set to be mutually the same direction, and both the center electrode and the common electrode were connected with power source lines. As is apparent from FIG. 11B, it can be confirmed that this piezoelectric resonator is not practical in use since the attenuation amount of the second harmonic wave mode SM is smaller than that of the fundamental mode FM.

While the square-shaped piezoelectric resonator has been employed in the above-described embodiment, the same effects as the above-described embodiment will be obtained when a rectangle-shaped piezoelectric resonator or a disk-shaped piezoelectric resonator is employed in the ladder type piezoelectric filter according to the present invention. Furthermore, the number of the series resonators and parallel resonators can be varied in accordance with the requirement. The larger the number of series and parallel resonators is, the greater the attenuation of the piezoelectric filter becomes. In addition, when the thickness of the parallel resonator is made smaller than that of the series resonator, the resultant capacitance ratio ($C_{02}/C_{01}$) could be increased so that the attenuation of the blocking range could be further increased.

In the thus constructed piezoelectric filter, since the center electrodes $2a$, $5a$ are connected with the common electrodes $2c$, $5c$ on the respective front/rear surfaces of the series and parallel resonators, these resonators can be easily and electrically connected with each other when they are in a stacked state. Therefore, the ladder type piezoelectric filter F formed in the stacked structure shown in FIG. 7 or 8 may be easily constructed. Also, since the shapes and the polarization directions of the above-described series resonator S and parallel resonator P are completely identical to each other, the polarizing process thereof can be easily performed.

If the thickness of the series resonator S is made identical to that of the parallel resonator P, the series resonator S would have the same structure as that of the parallel resonator P. Therefore, the parallel resonator P could be accomplished by performing such a postprocess operation that the center electrode $5a$ is electrically connected with the outer electrode $5b$ by using the conductive bridge $5d$. As a consequence, the structures of the series and parallel resonators according to the present invention are not different from such conventional structures that the thickness of the series and parallel resonators are made different from each other, and also the polarization directions thereof are made different from each other. As a consequence, the ladder type piezoelectric filter according to the present invention is higher in productivity.

On the other hand, the square-shaped piezoelectric resonator can possess higher productivity than that of the disk-shaped piezoelectric resonator since the square-shaped piezoelectric resonator can be cut from a piezoelectric ceramics plate without leaving any useless material. To the contrary, as represented in FIG. 9, it is confirmed that spurious emission S occurs near the second harmonic wave mode SM due to vibrations generated at the periphery of the resonator.

Figure 10A:
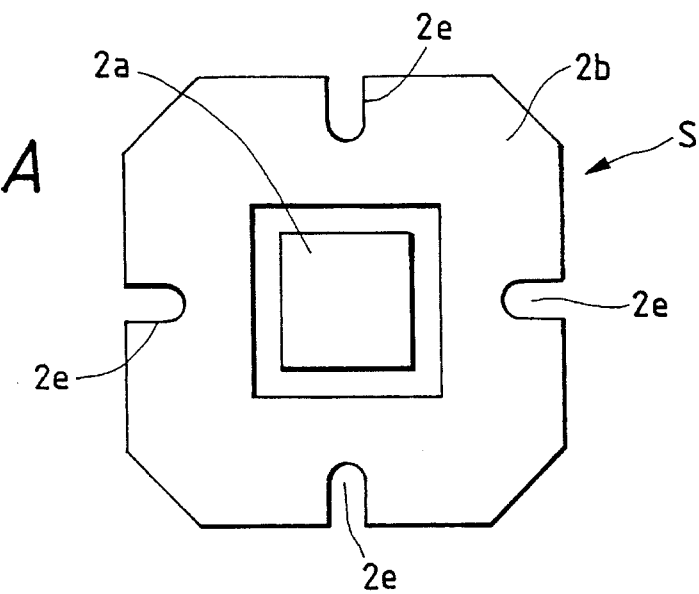
FIG. 10A is a plan view of a series resonator S with a slit formation.
Figure 10B:
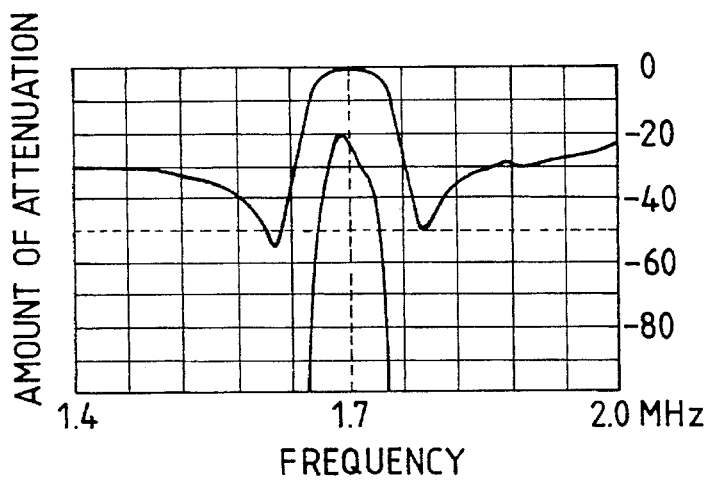
FIG. 10B is an attenuation characteristic diagram of a ladder type piezoelectric filter F using this series resonator S.

In this respect, as shown in FIG. 10A, when slits $2e$ are formed in each edge of the series resonator S in such a manner that these slits are positioned perpendicular to the respective edges, it can be seen from FIG. 10B that this spurious emission S is reduced. As a result, such a slit formation can greatly improve the resonator characteristics, while maintaining the merits in the production of the square-shaped resonator. It should be noted that the parallel resonator P has the same structure as that of FIG. 3.

According to the present invention, since the filtering characteristic usable in the high frequency ranges can be obtained, and the center electrodes and the common electrodes of the series and parallel resonators are electrically connected to each other on the front and rear surfaces thereof, the ladder type piezoelectric filter with employment of the stacked series and parallel resonators can be easily produced since the electrical connections of these resonators can be made easily when they are stacked.

Since the polarization condition of the actually used series resonator is identical to that of the actually used parallel resonator, the polarization process can be uniformly performed, so that easy manufacturing processes are available.

Furthermore, in accordance with the present invention, when the thickness of the series resonator is made completely identical to that of the parallel resonator, these resonators can possess completely the same structures up to the forming stage of the conductive bridge 5d. As a consequence, mass production of such series and parallel resonators can be considerably improved, and thus the high-frequency ladder type piezoelectric filter operable at frequencies higher than 1 MHZ can be realized with low cost, which could not be manufactured heretofore.

In the case of employing the square-shaped resonators, when the slits are formed in the respective edges of the resonator in such a manner that these slits are located perpendicular to these edges, respectively, the spurious emission S occurred near the second harmonic wave mode SM can be reduced. Thus, the filtering characteristic can be greatly improved, while maintaining the above-described manufacturing merit obtained by employing the square-shaped resonators.

What is claimed is:

1. A high-frequency ladder type piezoelectric filter comprising:

a series line between an input terminal and an output terminal;

a ground line;

a parallel branch connected between said series line and said earth line;

at least two adjacent series resonators, each having a resonant frequency higher than 1 MHz by utilizing a secondary double harmonic wave, each of said series resonators comprising a piezoelectric ceramic plate having a predetermined thickness, a center electrode, an outer electrode, and a common electrode, said center electrode and said outer electrode of said series resonator being provided on one surface of said piezoelectric ceramic plate in concentric relation and being electrically insulated from each other, said common electrode being provided on the other surface of said piezoelectric ceramic plate, each of said series resonators being arranged in said series line so that said center electrode of each said series resonator is connected to one of said input and output terminals, said common electrode of each said series resonator is connected to the other of said input and output terminals, and said outer electrode of said each said series resonator is electrically isolated from both said input and output terminals, said at least two adjacent resonators being interconnected so that the common electrode of one series resonator is connected to the center electrode of the adjacent series resonator; and a parallel resonator having a antiresonant frequency higher than 1 MHz by utilizing a secondary double harmonic wave, said parallel resonator comprising a piezoelectric ceramic plate having a predetermined thickness, a center electrode, an outer electrode, and a common electrode, said center electrode and said outer electrode of said parallel resonator being provided on one surface of said piezoelectric ceramic plate in a concentric relation and being electrically connected each other, said common electrode of said parallel resonator being provided on the other surface of said piezoelectric ceramic plate, said parallel resonator being arranged in said parallel branch so that said center electrode of said parallel resonator is connected to the common electrode of one of said series resonators and to the center electrode of the adjacent series resonator, and said common electrode of said parallel resonator is connected to said ground line;

a center electrode region and an outer electrode region of both said series resonators and said parallel resonator being mutually polarized along opposite directions;

the series resonators and the parallel resonator being stacked together in a case with at least an input terminal plate, an output terminal plate, a ground terminal plate, and a relay terminal plate.

2. A high-frequency ladder type piezoelectric filter as claimed in claim 1, wherein each of said series resonators has the same thickness as that of the respective parallel resonator.

3. A high-frequency ladder type piezoelectric filter as claimed in claim 1, wherein each of said series resonators and said parallel resonator are made in a substantially rectangular shape, and a slit is formed in each edge of each of said resonators perpendicular to said edge.

4. A high-frequency ladder type piezoelectric filter as claimed in claim 1, wherein said series resonators and said parallel resonator are made in a disk shape.

5. A high-frequency ladder type piezoelectric filter as claimed in claim 1, wherein said center electrode and said outer electrode of said parallel resonator is electrically connected by a conductive bridge.

6. A high-frequency ladder type piezoelectric filter as claimed in claim 1, wherein said series resonator is positioned between said input terminal and a point where said parallel branch is connected to said series line.

7. A high-frequency ladder type piezoelectric filter as claimed in claim 1, wherein an electrostatic capacitance of each of said series resonators is smaller than that of said parallel resonator.

* * * * *

UNITED STATES PATENT AND TRADEMARK OFFICE
CERTIFICATE OF CORRECTION

PATENT NO. : 5,574,414
DATED : November 12, 1996
INVENTOR(S) : Tatsuo OGAWA et al.

It is certified that error appears in the above-indentified patent and that said Letters Patent is hereby corrected as shown below:

Claim 1, Column 10, Line 13, after "connected", insert --to--.

Signed and Sealed this

Sixth Day of May, 1997

Attest:

BRUCE LEHMAN

Attesting Officer

Commissioner of Patents and Trademarks